US009826622B2

(12) United States Patent
Kuemmeth et al.

(10) Patent No.: US 9,826,622 B2
(45) Date of Patent: Nov. 21, 2017

(54) REDUCING NOISE AND TEMPERATURE DURING MEASUREMENTS IN CRYOSTATS

(71) Applicant: President and Fellows of Harvard College, Cambridge, MA (US)

(72) Inventors: Ferdinand Kuemmeth, Copenhagen (DK); Charles M. Marcus, Copenhagen (DK)

(73) Assignee: PRESIDENT AND FELLOWS OF HARVARD COLLEGE, Cambridge, MA (US)

( * ) Notice: Subject to any disclaimer, the term of this patent is extended or adjusted under 35 U.S.C. 154(b) by 964 days.

(21) Appl. No.: 14/011,176

(22) Filed: Aug. 27, 2013

(65) Prior Publication Data

US 2015/0060190 A1   Mar. 5, 2015

(51) Int. Cl.
   *G01N 25/00*   (2006.01)
   *H05K 1/02*   (2006.01)
   *G10K 11/162*   (2006.01)
   *H05K 1/03*   (2006.01)

(52) U.S. Cl.
   CPC ......... *H05K 1/0204* (2013.01); *G10K 11/162* (2013.01); *H05K 1/0306* (2013.01)

(58) Field of Classification Search
   None
   See application file for complete search history.

(56) References Cited

U.S. PATENT DOCUMENTS 6,347,147 B1* 2/2002 Downs, Jr. ............ H04R 17/02
   381/114

2002/0018509 A1* 2/2002 Boiarski ................ F25B 9/02
   374/11
2010/0157552 A1* 6/2010 Thom ..................... H01L 39/14
   361/752

OTHER PUBLICATIONS

Bluhm et al., "Dissipative cryogenic filters with zero dc resistance", Review of Scientific Instruments, 79, 014703, American Institute of Physics, 2008, pp. 014703-1-014703-6.
Martinis et al., "Experimental tests for the quantum behavior of a macroscopic degree of freedom: the phase difference across a Josephson junction", Physical Review B, vol. 35, No. 10, 1987 The American Physical Society, pp. 4682-4698.
Santavicca et al., "Impedance-matched low-pass stripline filters", Measurement Science and Technology, 2008 IOP Publishing Ltd, pp. 1-5.
Lukashenko et al., "Improved powder filters for qubit measurements" Review of Scientific Instruments 79, 2008 American Institute of Physics, pp. 01470-1-014701-4.
Milliken et al., "50 Ω characteristic impedance low-pass metal power filters" Review of Scientific Instruments 78, 2007 American Institute of Physics, pp. 024701-1-024701-5.

* cited by examiner

*Primary Examiner* — Erica Lin
(74) *Attorney, Agent, or Firm* — Gesmer Updegrove LLP

(57) ABSTRACT

A device is disclosed to reduce noise and temperature during measurements in cryostats comprising, the device comprising any of, or a combination of, the following PC boards, each conditioning a different frequency range: a RC-PC board having a two-stage RC filter in series with a surface-mounted pi-filter; a RF-PC board having a plurality of surface-mounted pi-filters in series, each configured with different low-frequency cutoff frequencies; and a Sapphire-PC board having a sapphire substrate having high heat conductivity at low temperature with thin metal films routed in a meandering fashion.

17 Claims, 14 Drawing Sheets

REDUCING NOISE AND TEMPERATURE DURING MEASUREMENTS IN CRYOSTATS

SPONSORSHIP INFORMATION

This invention was made with government support under Grant No. DMR-0908070 from the National Science Foundation, Grant No. W911NF-10-1-0330 from the U.S. Army/ARO, and Grant No. HR0011-09-1-0007 from the U.S. Department of Defense/DARPA. The government has certain rights in this invention.

BACKGROUND OF THE INVENTION

Field of Invention

The present invention relates generally to the field of cryostats. More specifically, the present invention is related to reducing noise and temperature during measurements in cryostats.

Discussion of Related Art

Since the 1960s, the most widely used type of cryostat for low-temperature measurements (i.e. below 1° Kelvin) is the dilution refrigerator. Presently, cryostats are commercially available from a variety of manufacturers (e.g., Oxford Instruments, Leiden Cryogenics, Janis Cryogenics, BlueFors, ICEoxford, and Cryoconcept) and they are used in most low-temperature laboratories world-wide. Typically, a dilution refrigerator is specified by the manufacturer to cool a device under test (DUT), such as semiconductors, crystals, complex oxides, novel electronic devices, quantum bits, etc. with a certain cooling power and base temperature. In this respect, temperature is understood as the phonon temperature (lattice vibrations) of the DUT. Due to the suppression of electron-phonon coupling at low temperatures and the sensitivity to electrical noise, the actual temperature of the electrons in the DUT is typically much higher than the phonon temperature, particularly if the DUT is characterized by electrical measurements. In fact, it is very challenging to obtain an electron temperature as low as the phonon temperature and, hence, commercially available cryostats do not specify their cooling performance with regards to electron temperature.

However, for the majority of customers, it is the electron temperature in the signal lines as well as the electrical noise environment that is most important; for example, for the performance of low temperature electronic devices, quantum bits, etc.

For this reason, many research groups have developed devices that can reduce the electron temperature and electrical noise. These devices are installed inside the cryostats to extend their cooling performance to the electronic domain. Some of these efforts have been going on for many years with varying degrees of success, and some techniques have been published. Examples of such published techniques/devices can be found in the paper to Lukashenko et al. entitled "Improved Powder Filters for Qubit Measurements", the paper to Milliken et al. entitled "50Ω Characteristic Impedance Low-Pass Metal Powder Filters", the paper to Santavicca et al. entitled "Impedance-Matched Low-Pass Stripline Filters", the paper to Bluhm et al. entitled "Dissipative Cryogenic Filters with Zero DC Resistance" and the paper to Martinis et al. entitled "Experimental Tests for the Quantum Behavior of a Macroscopic Degree of Freedom: The Phase Difference Across a Josephson Junction". These homebuilt devices are often unreliable, difficult to build, or large in size. One major vendor of dilution refrigerators (Leiden Cryogenics BV, The Netherlands) is offering cryostats with integrated devices to reduce the electron temperature and electrical noise on each individual electrical signal line.

Oxford Instruments, UK, intends to develop a comparable or better product for their cryostats. Since approximately 2005, the majority of cryostats sold by Oxford Instruments are so-called cryogenfree dilution refrigerators that employ a pulse tube cooler and cryostat-mounted turbomolecular pump, wherein such a setup allows continuous operation without expensive cryogens (such as liquid helium), but adds electrical noise induced by mechanical vibrations and magnetic induction. The resulting electrical noise can only be filtered inside the cryostat, and hence methods and devices that allow signal conditioning at low temperatures are needed even more than before the advent of cryogen-free dilution refrigerators.

Further, although a huge variety of commercial filters for electrical signal condition near room temperature (−55° C. . . . 100° C. Celsius), none of these are specified to work at cryogenic temperatures.

Embodiments of the present invention are an improvement over prior art systems and methods.

SUMMARY OF THE INVENTION

The present invention methods and devices offer a reliable and cost-effective way of manufacturing signal-conditioning devices, and the performance of the present invention's methods and devices have been demonstrated in various cryostats. The present invention's methods and devices offer several innovations compared to published or commercially available devices, including, but not limited to, low-pass filters or copper powder heat sinks. One important feature according to the teachings of the present invention is that cooling and noise reduction is achieved on multiple signal lines simultaneously (currently, 24 signal lines within one device), and that each device can be manufactured from commercially available or custom-made, relatively cheap components. All components are selected based on their small size, availability, and performance at extremely low temperatures. The present invention's devices are very compact in size, are of modular design (stacked on top of each other and in series to improve performance), and can easily be serviced and reconfigured for a range of applications. For example, the DC resistance, the capacitive load and the low-frequency cut-off frequency can all be adjusted for each individual signal line, without having to purchase a new filter array.

The present invention provides a device to reduce noise and temperature during measurements in cryostats, wherein the device comprises any of, or a combination of, the following PC boards, with each board conditioning a different frequency range: (a) a RC-PC board having a two-stage RC filter in series with a surface-mounted pi-filter (e.g., a 7-segment surface-mounted pi-filter that is configured for filtering a frequency range of 1 kHz-100 MHz); (b) a RF-PC board having a plurality of surface-mounted pi-filters in series (e.g., three 7-segment surface-mounted pi-filter surface-mounted pi-filters in series configured with different cut-off frequencies, e.g., 80 MHz, 1450 MHz, and 5 GHz, respectively), each configured with different low-frequency cutoff frequencies; and (c) a Sapphire-PC board having a sapphire substrate having high heat conductivity at low temperature with thin metal films routed in a meandering fashion, wherein each of the boards may be further enclosed in a high-conductivity metal enclosure such as a gold-plated high conductivity copper enclosure.

The present invention also discloses a kit to reduce noise and temperature during measurements in a cryostats, said kit comprising the following modular filters, each modular filter conditioning a different frequency range: (a) a RC-PC board having a two-stage RC filter in series with a surface-mounted pi-filter (e.g., a 7-segment surface-mounted pi-filter that is configured for filtering a frequency range of 1 kHz-100 MHz), the RC-PC board enclosed in a high-conductivity metal enclosure; (b) a RF-PC board having a plurality of surface-mounted pi-filters in series (e.g., three 7-segment surface-mounted pi-filter surface-mounted pi-filters in series configured with different cut-off frequencies, e.g., 80 MHz, 1450 MHz, and 5 GHz, respectively), each configured with different low-frequency cutoff frequencies, the RF-PC board enclosed in a high-conductivity metal enclosure; and (c) a Sapphire-PC board having a sapphire substrate having high heat conductivity at low temperature with thin metal films routed in a meandering fashion, the Sapphire-PC board enclosed in a high-conductivity metal enclosure.

BRIEF DESCRIPTION OF THE DRAWINGS

The present disclosure, in accordance with one or more various examples, is described in detail with reference to the following figures. The drawings are provided for purposes of illustration only and merely depict examples of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

DESCRIPTION OF THE PREFERRED EMBODIMENTS

Figure 1:
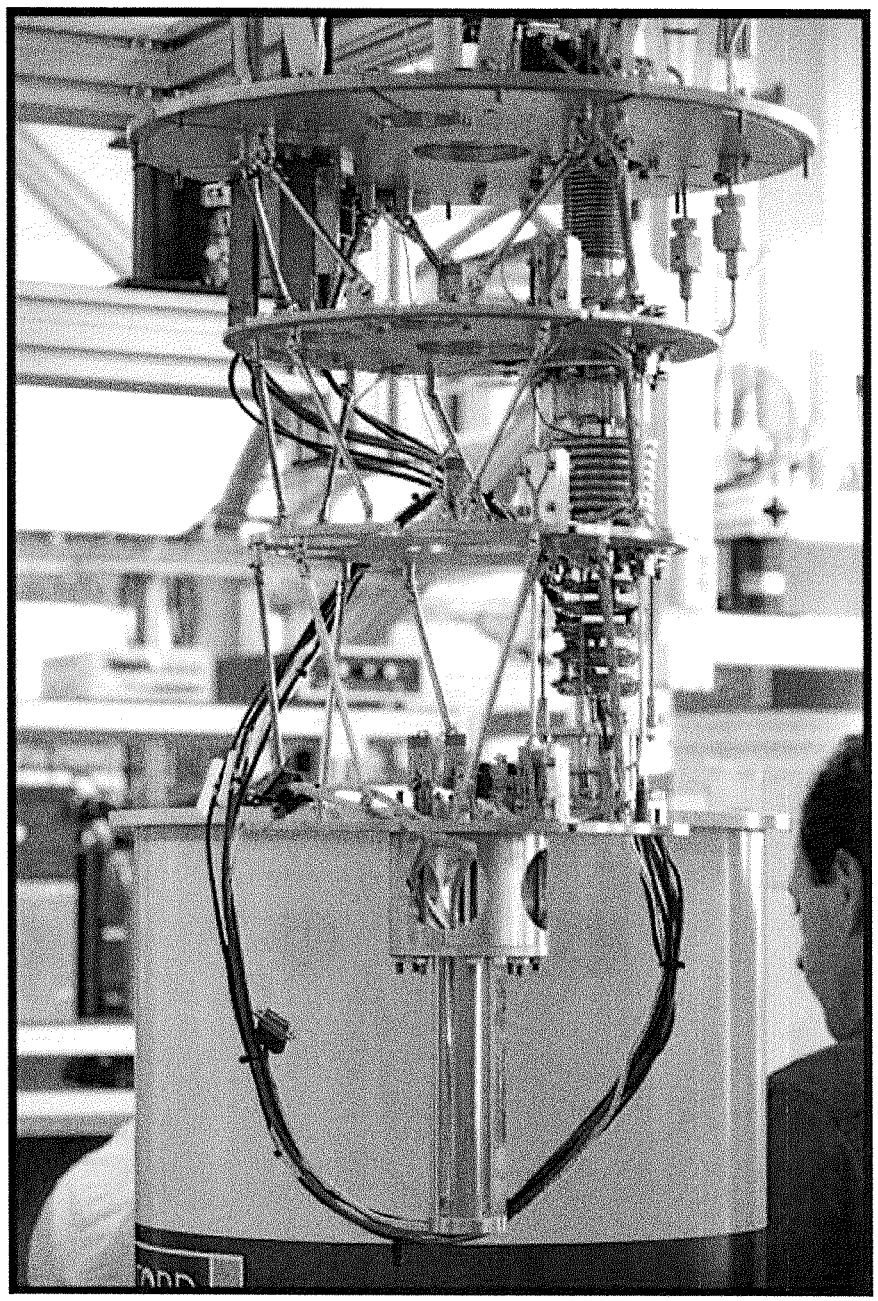
FIG. 1 depicts a dilution refrigerator as supplied by Oxford Instruments.

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

Note that in this description, references to "one embodiment" or "an embodiment" mean that the feature being referred to is included in at least one embodiment of the invention. Further, separate references to "one embodiment" in this description do not necessarily refer to the same embodiment; however, neither are such embodiments mutually exclusive, unless so stated and except as will be readily apparent to those of ordinary skill in the art. Thus, the present invention can include any variety of combinations and/or integrations of the embodiments described herein.

Figure 2:
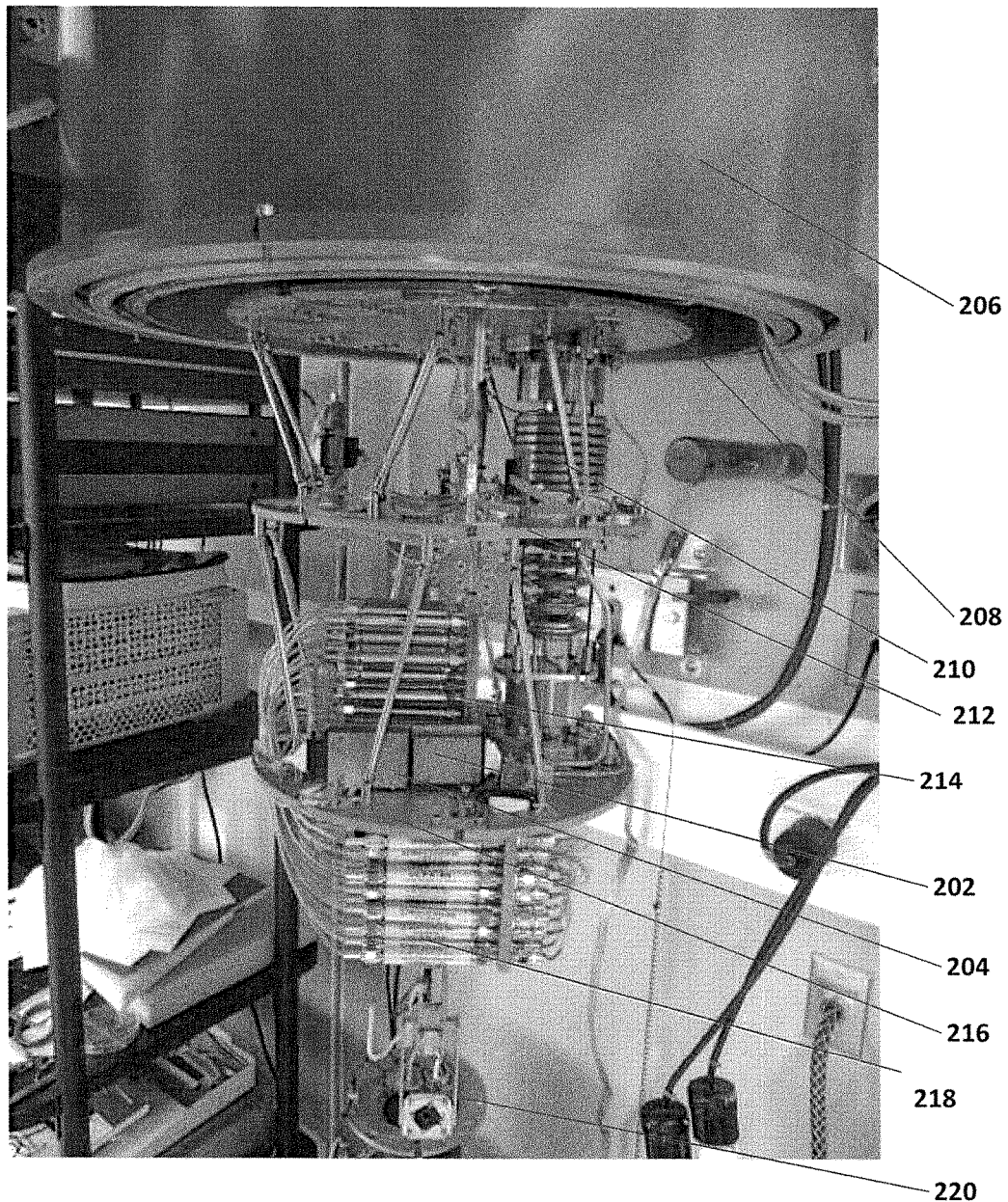
FIG. 2 illustrates the same type of dilution refrigerator as FIG. 1, but modified according to the teachings of the present invention, wherein the modification includes a cooling plate with various electronic filters and heat sinking devices, in order to assess and reduce the electron temperature and noise in the cryostat.

FIG. 1 depicts a dilution refrigerator as supplied by Oxford Instruments. To achieve a low temperature of the electrons in the device under test (DUT), as well as a low electrical noise environment, a wide range of frequencies has to be converted from electrical signal lines to heat. The present invention accomplishes this via a set of modular filters, and the heat is then removed from the filters by the cooling stage of the cryostat, such as the mixing chamber plate of a dilution refrigerator. FIG. 2 illustrates the dilution refrigerator of FIG. 1 that is modified according to the teachings of the present invention, wherein the modification includes a cooling plate with various electronic filters and heat sinking devices, in order to assess and reduce the electron temperature and noise in the cryostat.

The two small copper boxes/enclosures 202, 204 in the center of the photo contain the prototype devices. The enclosures 202, 204 of the filters are made from high-conductivity copper (type OFHC) and gold-plated for better thermal conductance at low temperatures. The high-conductivity metal enclosures 202, 204 also serve as an electrical ground, as well as an electrical shield that prevents electrical radiation from entering the filters and signal lines.

It should be noted that while FIG. 2 depicts the enclosures in a side-by-side configuration, the enclosures may be arranged in any order. For example, the enclosures 202, 204 can be stacked on top or next to each other for most efficient use of space inside a cryostat. Each enclosure contains a filter array based on PC board technology that can condition 24 signal lines within each device. It should also be noted that throughout the specification 24 signal lines are mentioned only as an example. Hence, the number of signal lines should not be used to limit the scope of the invention.

FIG. 2 also shows basic components of a dilution refrigerator: vacuum can that encloses all cooling stages (206), still plate (0.7-1 Kelvin, 208), heat exchanger between still and condenser line (210), cold plate (0.1 Kelvin, 212), and the mixing chamber plate (0.01 Kelvin, 216). Also visible are various modifications by the inventor, including a top (214) and bottom (218) mounted filter array to test the low temperature performance of multi-stage RF-filters, different types of signal lines and their mutual shielding, as well as a low-temperature sample holder (220) that can be rotated about two independent axes inside a strong magnetic field.

Figure 3A:
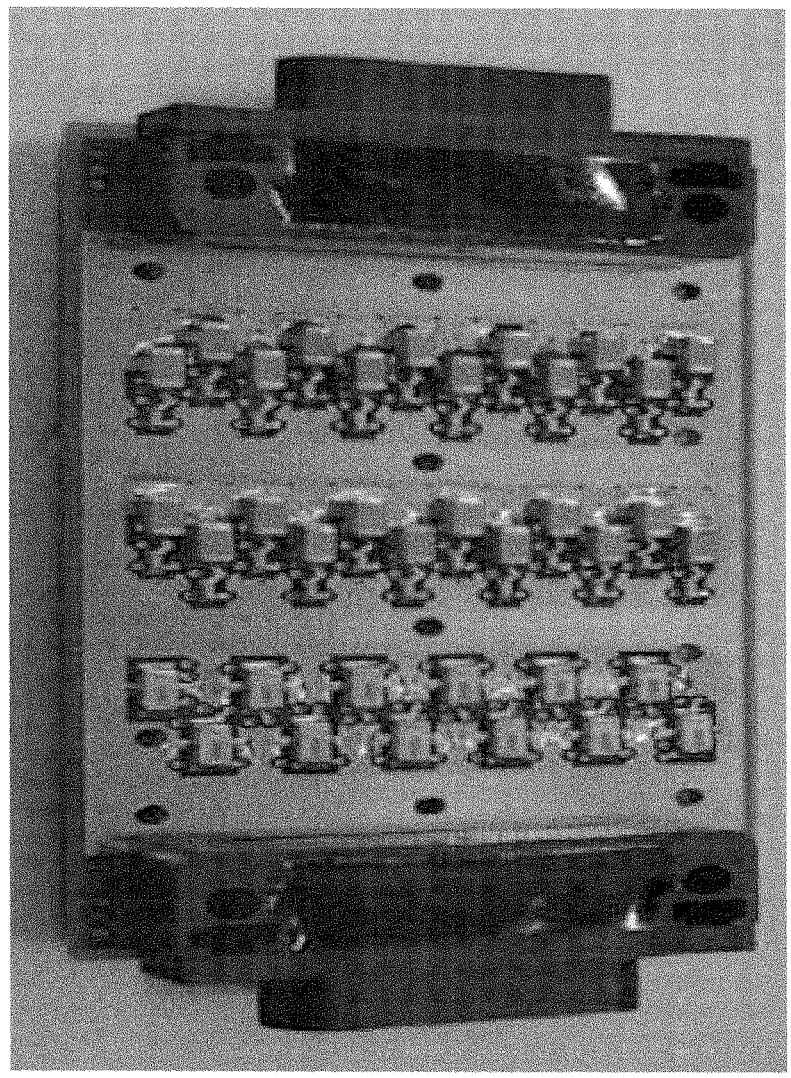
FIG. 3A depicts a RC-PC board where the board has a two-stage RC filter in series with a 7-segment surface-mounted pi-filter.

To increase the flexibility of the present invention's devices and their range of applications, the filter components are grouped into the following three PC boards of the same size, each conditioning a different frequency range:

1) RC-PC Board: FIG. 3A depicts a RC-PC board where the board has a two-stage RC filter in series with a 7-segment surface-mounted pi-filter. It is configured for filtering a frequency range of typically 1 kHz-100 MHz. It is based on a four-layer PC board that includes various inter-layer vias and intra-layer ground planes to improve heat sinking and mutual shielding. In the RC-PC board of FIG. 3, 12 signal lines are filtered and heat-sunk on the front side and 12 signal lines are on the back side. Also, seen in the RC-PC board of FIG. 3A are non-magnetic micro-D connectors, surface mount capacitors, resistors, and pi-filters, as well as copper ground and cooling planes.

Figure 3B:
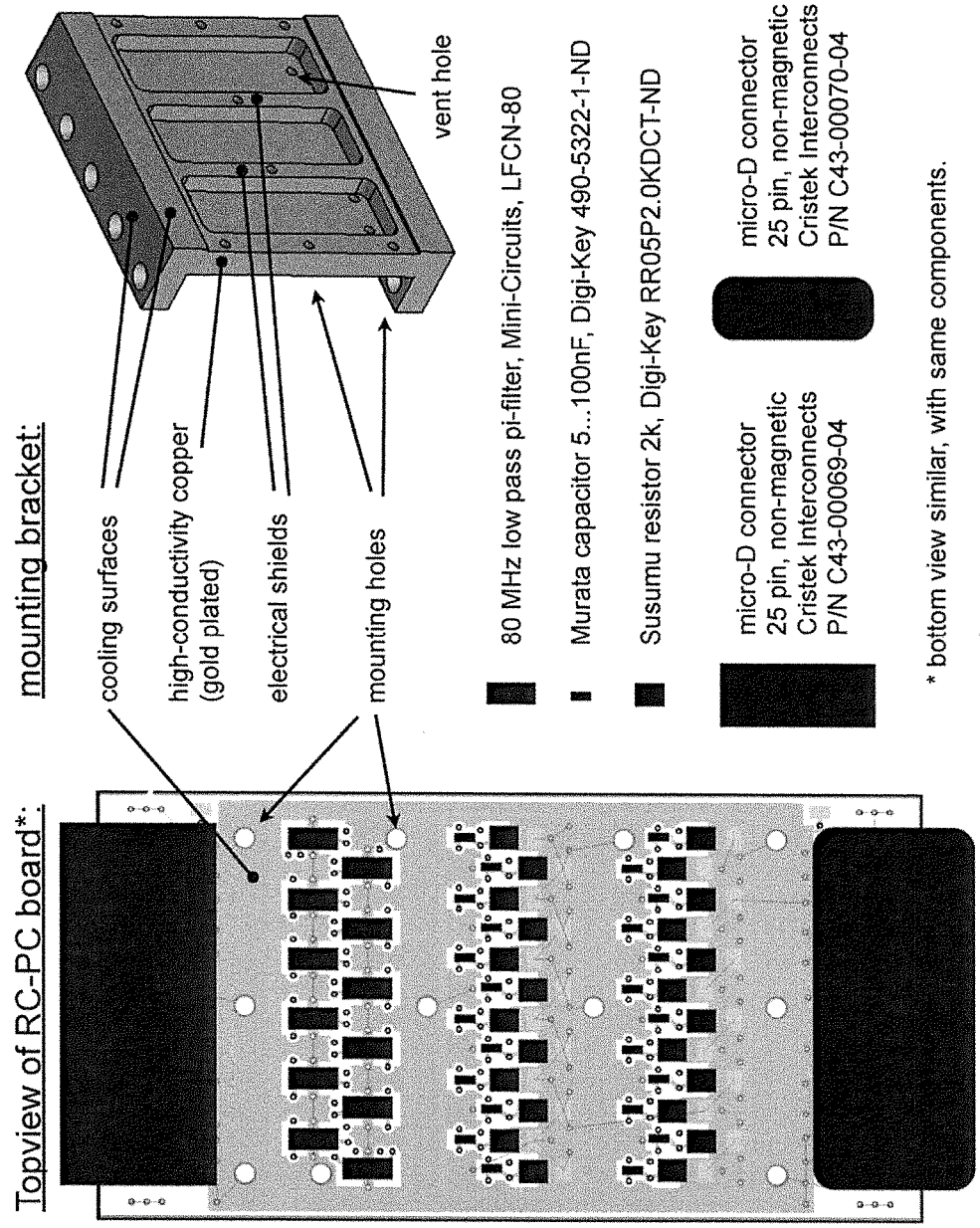
FIG. 3B illustrates the layout of the components on the RC-PC Board of FIG. 3A, along with a depiction of one mounting bracket.
Figure 3C:
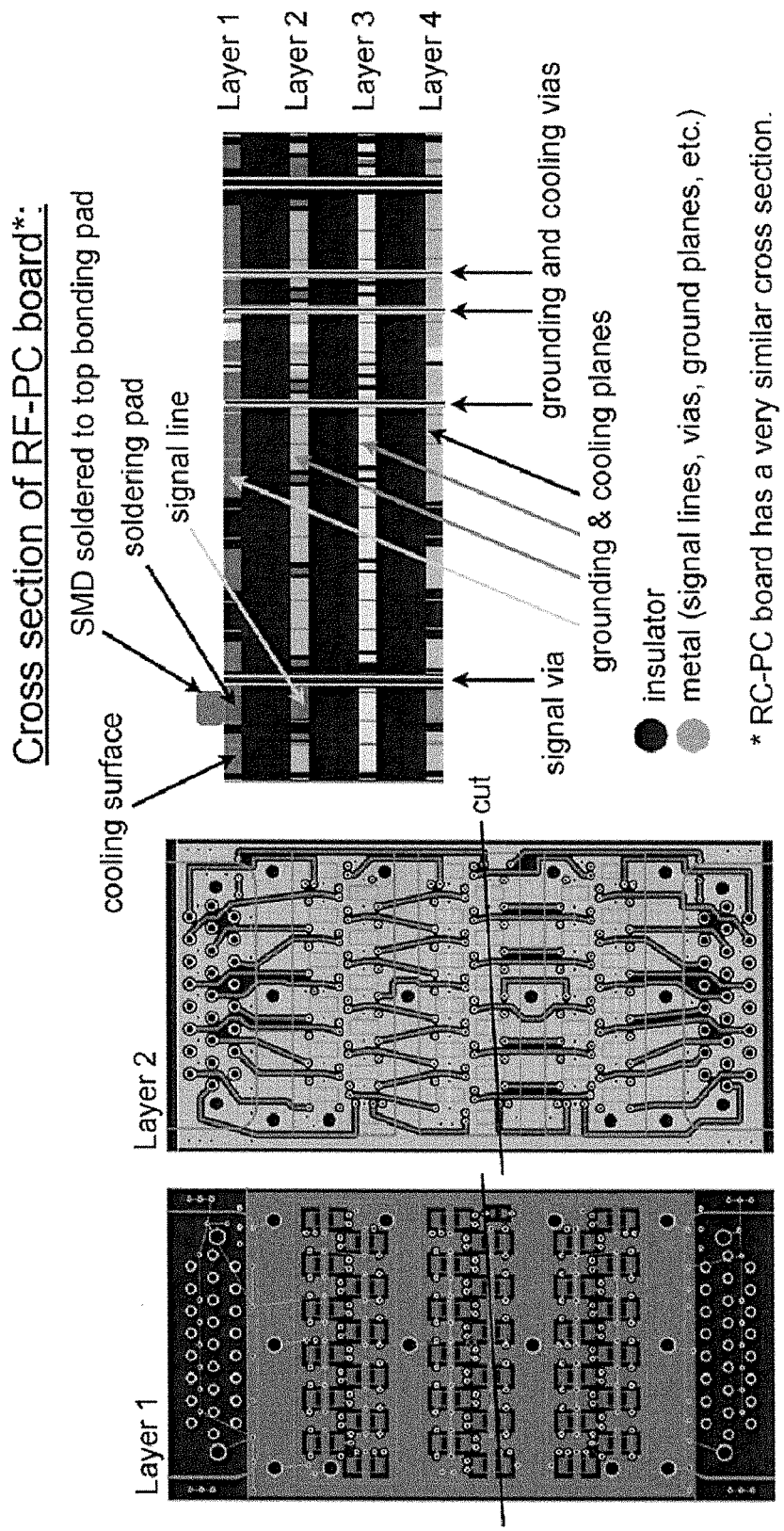
FIG. 3C depicts a cross section of the RF-PC board.

The layout of these components on the RC-PC Board of FIG. 3A is shown in FIG. 3B, along with a depiction of one mounting bracket. Two mounting brackets are required to mount one RC-PC board filter, such that the board gets cooled from both sides. For best electrical and thermal performance, these mounting brackets are manufactured from gold-plated, high-conductivity copper. The RC-PC board is almost identical to the RF-PC board, except for minor differences in the size of the surface soldering pads and signal routing. FIG. 3C depicts a cross section of the RF-PC board, wherein its cross section is—in terms of its layers and structure—therefore nearly identical to the RC-PC board. Note that all four metal layers (labeled "Layer 1", "Layer 2", "Layer 3" and "Layer 4" in FIG. 3C) contain grounding planes that shield different signal lines from each other, thereby reducing propagation of electrical noise. Grounding vias establish electrical connections to the top- and bottom-most grounding planes and, therefore, serve as cooling pathways and electrical shields. The outermost grounding planes are cooled by being in good electrical contact with the cooling surfaces (labeled "cooling surface" in FIG. 3C) of the mounting brackets. In order to mutually shield the three filter stages (80 MHz stage and two RC stages), the mounting bracket has three "buckets" milled from its inside, which serve as Faraday cages. These Faraday cages are separated from each other by ridges labeled "electrical shields", and vent in vacuum via several small vent holes.

Figure 4A:
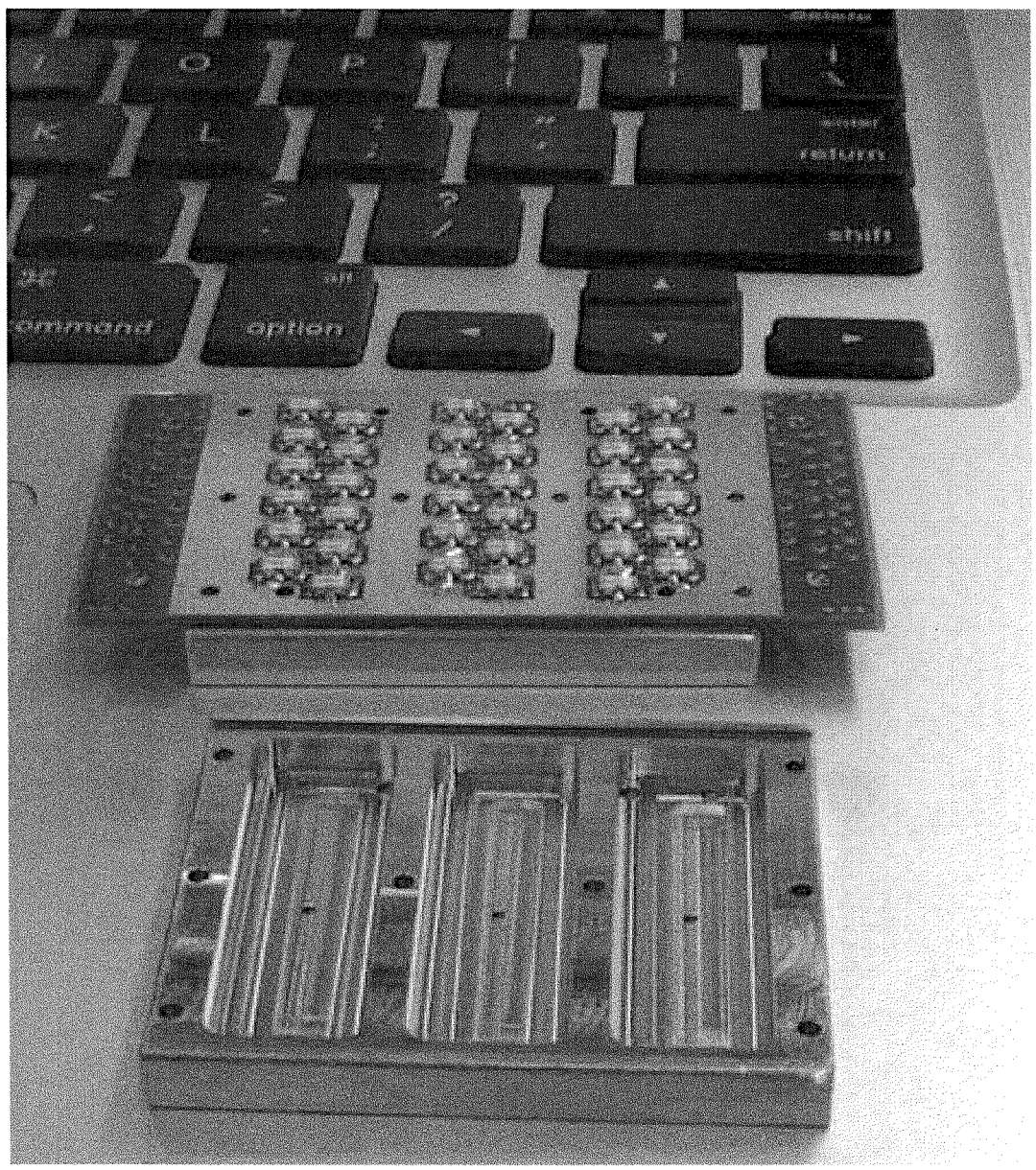
FIG. 4A depicts a RC-PC board (before mounting inside a filter enclosure and shown without the connectors) and a gold-plated, high-conductivity copper enclosure (keyboard shown for a reference of scale), where the board has three surface-mounted pi-filters in series, where each pi-filter is a 7-segment surface-mounted pi-filter configured with different low-frequency cutoff frequencies.

2) RF-PC Board: FIG. 4A depicts a RC-PC board (before mounting inside a filter enclosure and shown without the connectors) and a gold-plated, high-conductivity copper enclosure (keyboard shown for a reference of scale), where the board has three surface-mounted pi-filters in series, where each pi-filter is a 7-segment surface-mounted pi-filter configured with different low-frequency cutoff frequencies. Typical values are 80 MHz-1450 MHz-5 GHz. It is based on a four-layer PC board that includes various inter-layer vias and intra-layer ground-planes to improve heat sinking and mutual shielding, and surface-mount components.

Figure 4B:
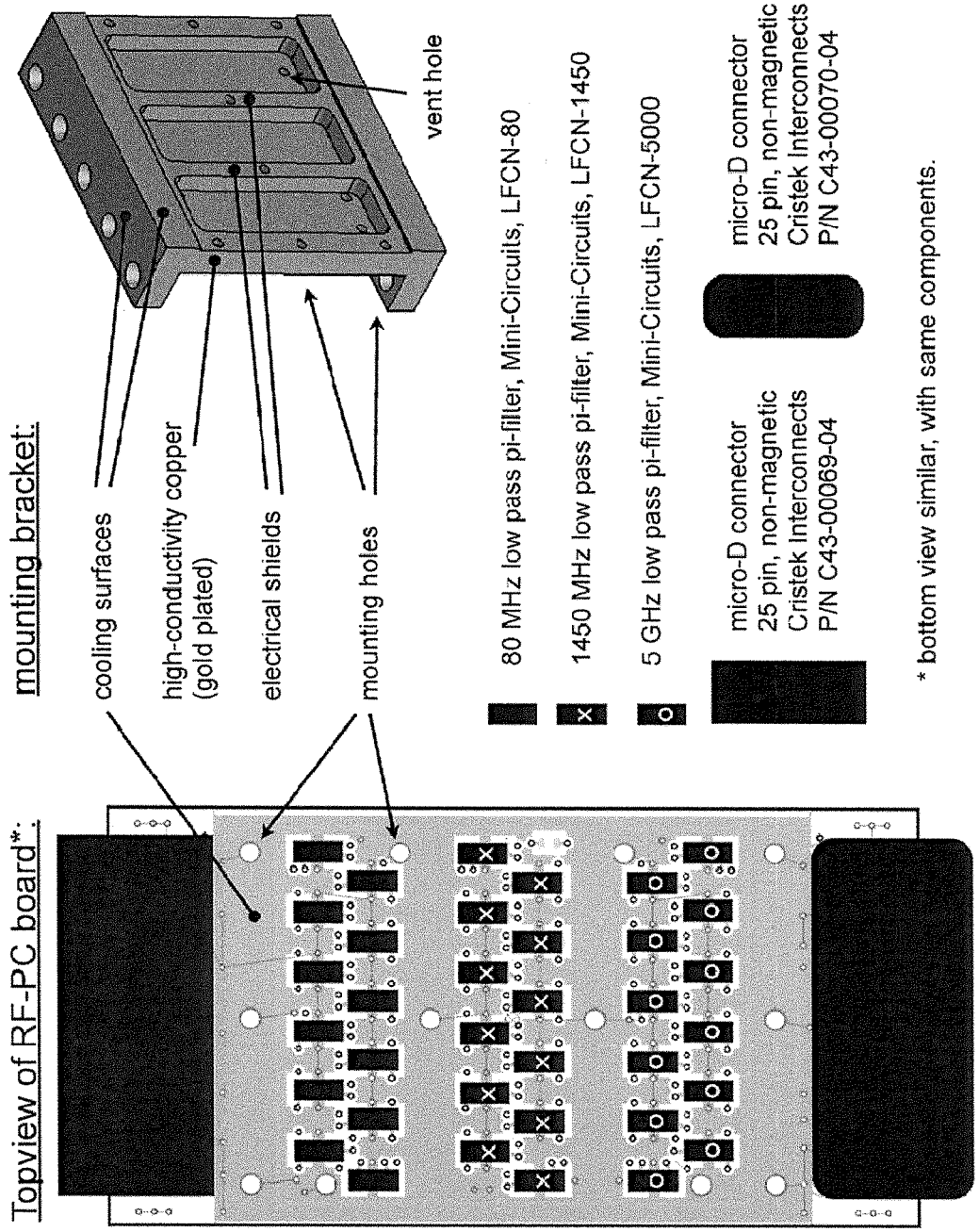
FIG. 4B depicts the layout of the surface mount components of the RF-PC board.

The cross section of the RF-PC board is shown in FIG. 3C, for a cut along the line indicated in the left panels. Note that all four metal layers (labeled "Layer 1", "Layer 2", "Layer 3" and "Layer 4" in FIG. 3C) contain grounding planes that shield different signal lines from each other, thereby reducing propagation of electrical noise. Grounding vias establish electrical connections to the top- and bottom-most grounding planes, and therefore serve as cooling pathways and electrical shields. The outermost grounding planes are cooled by being in good electrical contact with the cooling surfaces (labeled "cooling surface" in FIG. 3C) of the mounting brackets. As in the case of RC-PC board filters, these mounting brackets are therefore fabricated from gold-plated, high-conductivity copper. The layout of the surface mount components of the RF-PC board is shown in FIG. 4B. In order to mutually shield the three filter stages (80 MHz, 1450 MHz, 5 GHz), the mounting bracket has three "buckets" milled from its inside which serve as Faraday cages. These Faraday cages are separated from each other by ridges labeled "electrical shields", and vent in vacuum via several small vent holes. For best performance, two mounting brackets are needed for one RF-PC board filter.

Figure 5A:
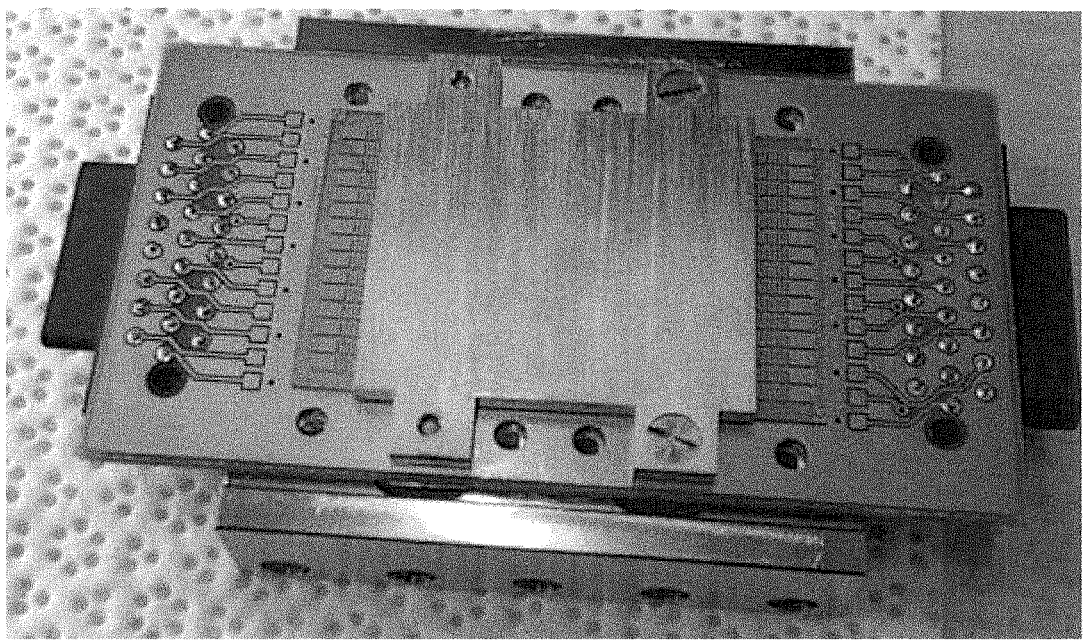
FIG. 5A depicts a Sapphire-PC board having a sapphire substrate (high heat conductivity at low temperature) with thin metal films routed in a meandering fashion.

3) Sapphire-PC Board: FIG. 5A depicts a Sapphire-PC board having a sapphire substrate (high heat conductivity at low temperature) with thin metal films routed in a meandering fashion. The center region in FIG. 5A is a thin sapphire substrate (transparent) with thin-film metal meanders (gold colored) that allow thermalization of more than 12 signal lines on each side of this board. It is optimized for best heat sinking and filtering in various ways (surface roughness, multi-layered metal deposition consisting of Cr, Au, and annealing steps, cooling and grounding clamp, gold-plated PC board, etc.).

Figure 5B:
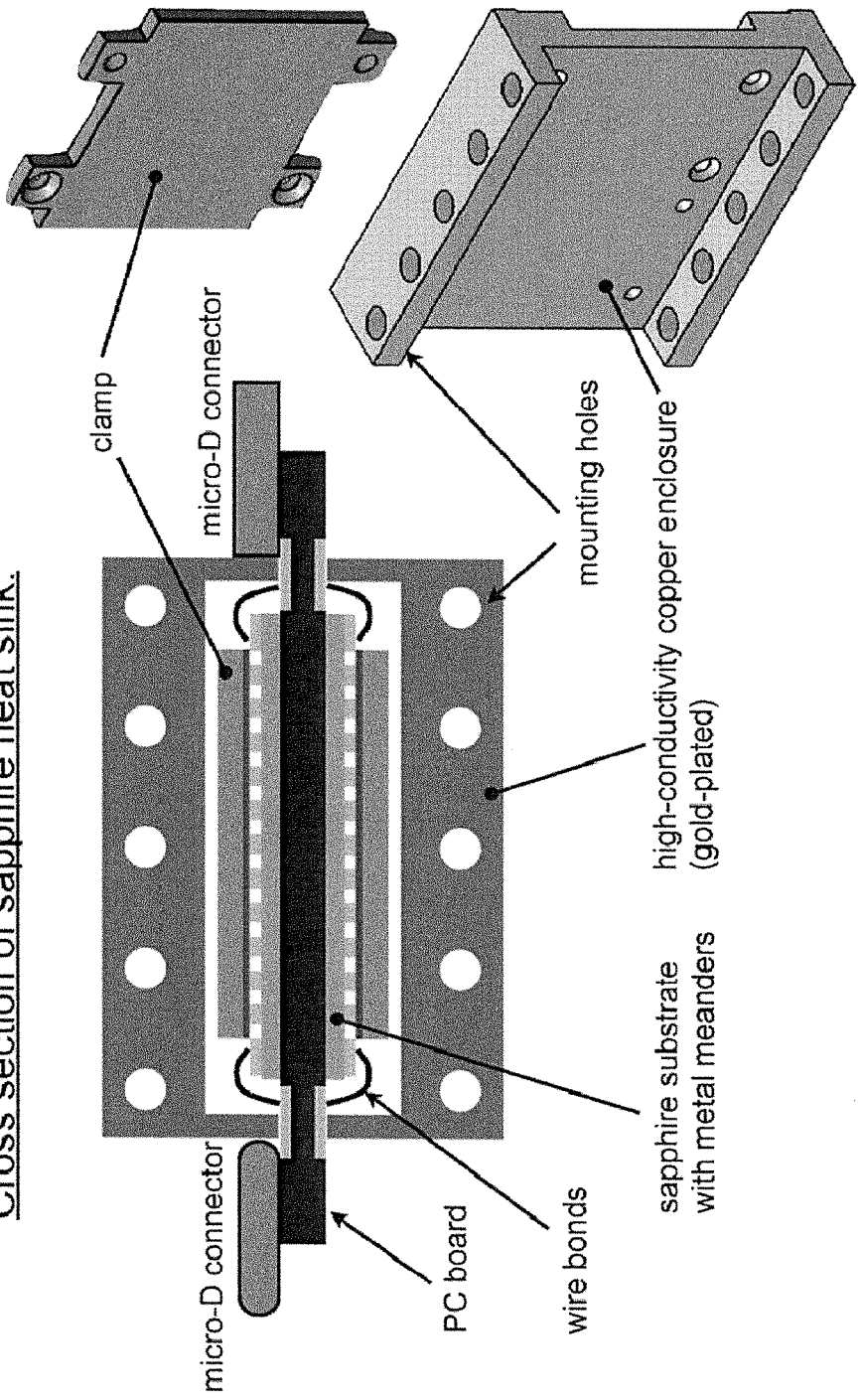
FIG. 5B depicts the cross section of an assembled sapphire-PC board filter.
Figure 6:
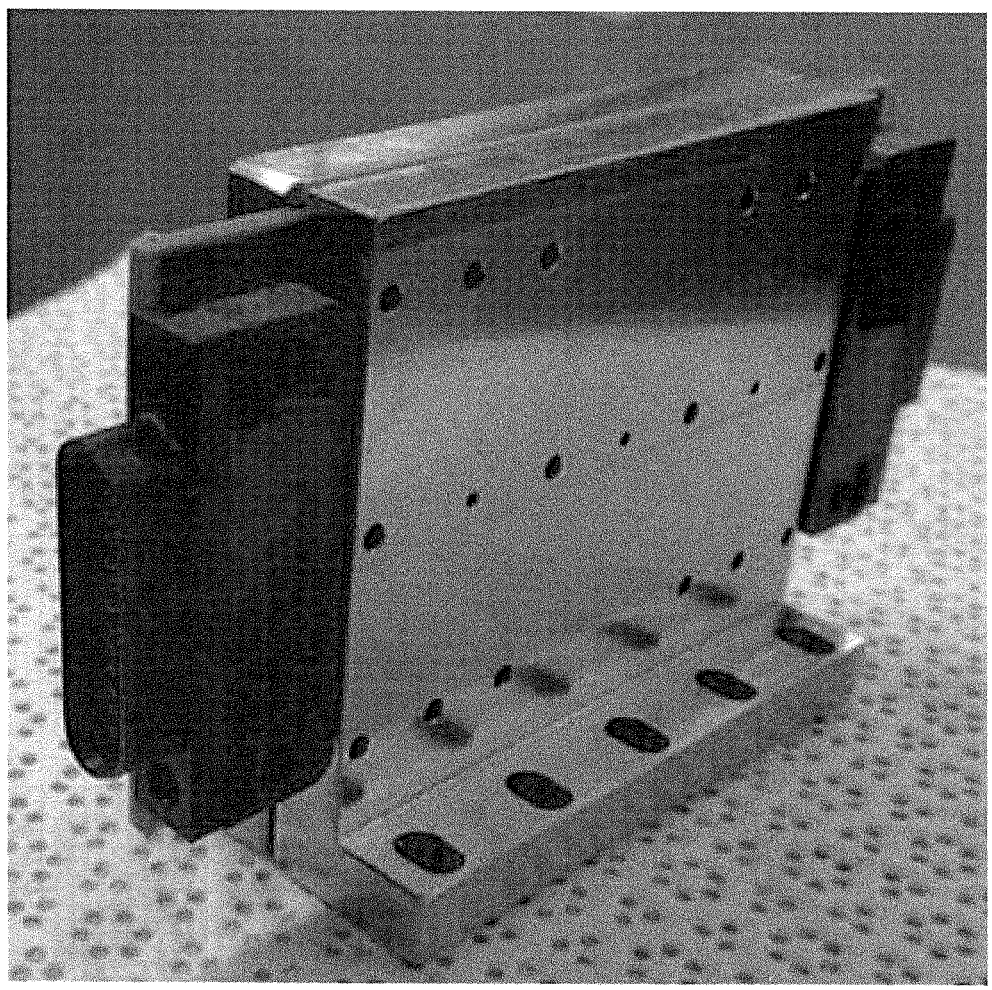
FIG. 6 depicts the Sapphire-PC Board inside the high-conductivity metal enclosure, ready to be installed inside of a cryostat.

The cross section of an assembled sapphire-PC board filter is schematically shown in FIG. 5B. The PC board serves as structural support for the two non-magnetic micro-D connectors, and the two sapphire substrates. Electrical connection between the connectors and the resistive metal meanders on the sapphire is provided by a combination of signal lines on the PC board, and standard wire bonds. The sapphire substrates are coated on their bottom side by an annealed gold-chromium or titanium-gold alloy, and pushed onto the gold-plated PC board by two clamps (insulated by thin Mylar film). This ensures good cooling (the PC board is cooled via the gold-plated, high-conductivity copper mounting brackets) and provides an additional ground plane above the meanders. Again, the footprint of the mounting holes is fully compatible with both the RC-PC board filters and RF-PC board filters, such that multiple filters can be mounted on top of each other in various configurations. FIG. 6 depicts the Sapphire-PC Board inside the high-conductivity metal enclosure, ready to be installed inside of a cryostat.

Techniques have also been developed to reduce the acoustic noise produced by the cryostat, resulting in a reduced exposure of the cryostats' operators and laboratory staff to environmental noise in the frequency range of hundreds to thousands of Hertz.

Currently all cryogen-free dilution refrigerators employ pulse-tube coolers as their primary cooling stage. The operation of pulse tubes produces a significant amount of mechanical vibrations and acoustic noise. Oxford Instruments made great efforts to decouple the mechanical vibrations of the pulse tube from the cooling stages of the cryostat (as this would affect its performance in a negative way).

However, Oxford Instruments (and all of the other manufacturers of dilution refrigerators) provides no means of reducing the acoustic noise produced by the pulse tube. This constitutes a serious drawback of cryogen-free refrigerators in that the acoustic noise affects anyone who is working in the same room as the refrigerator. This is particularly troubling given that dilution refrigerators (due to their high costs) are often part of larger laboratories or shared facilities in research centers, in which many other activities are going on at the same time. There are several solutions, one of which involves users working near dilution refrigerators wearing noise-cancelling headphones (which has been tried, but greatly reduces the interaction among researchers, and hence their performance). Another solution involves laboratories that are constructed in a special layout that separates the "noisy" part of the cryostat from the work and data acquisition part. This is an expensive solution as it may involve a two-story research lab.

Therefore, an efficient and low-cost solution was developed to reduce the acoustic noise produced by the cryostat that does not require personal protective equipment or the restructuring of a laboratory. This is done by absorbing the acoustic noise right where it is produced, namely at the rotary valve of the pulse tube and its pressure connections, the gas ballasts of the pulse tube and its pressure connections, and parts of the cryostat's vacuum chamber. The noise absorption is achieved by cutting sound absorbing foam (heavy rubber+foam, commercially available for the use in sound studios etc.) to size and fitting it tightly around the noisy parts of the cryostat. It has been verified that this does not negatively affect the cooling power of the cryostat, and it is believed that any customer would benefit from such a noise-reducing upgrade. Using such a setup, 7 cryogen-free dilution refrigerators were run within a single laboratory.

Figure 7:
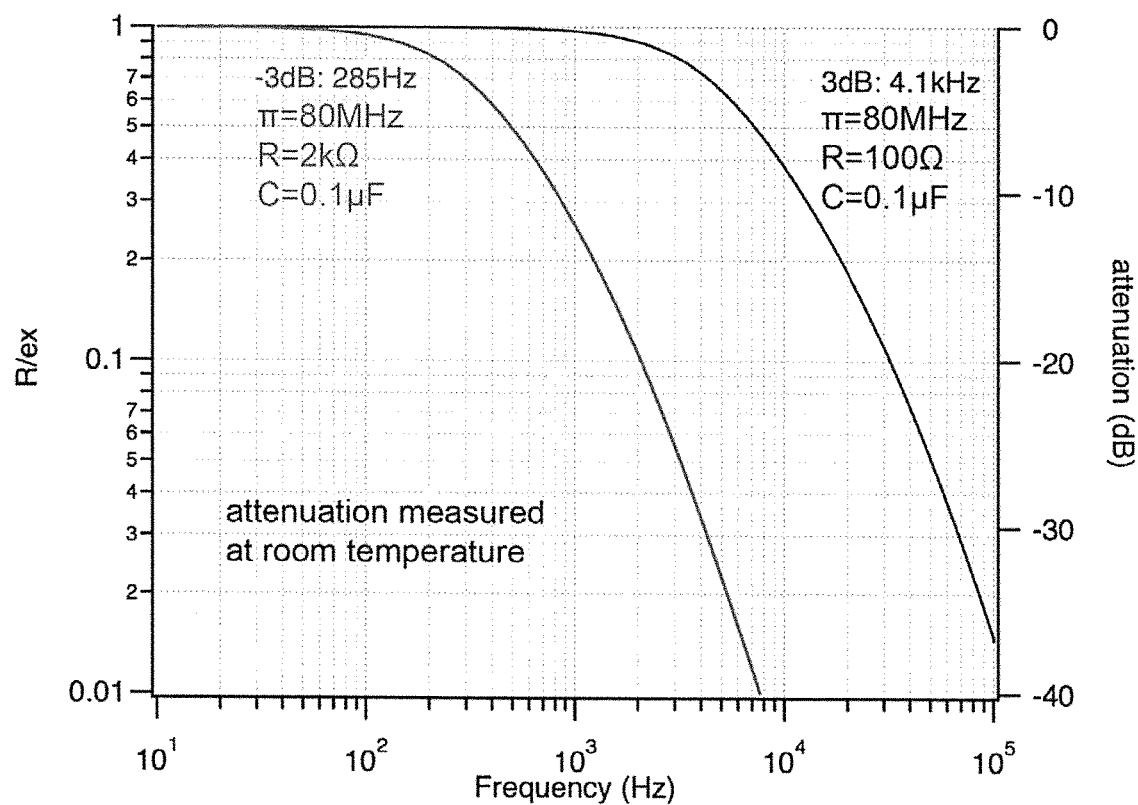
FIG. 7 illustrates that the cut-off frequency (and hence rise time of signals) can be changed, and optimized for different types of experiments, simply by changing the surface mount components (R, C, or pi-filters are all compatible with industrial soldering robots).
Figure 8:
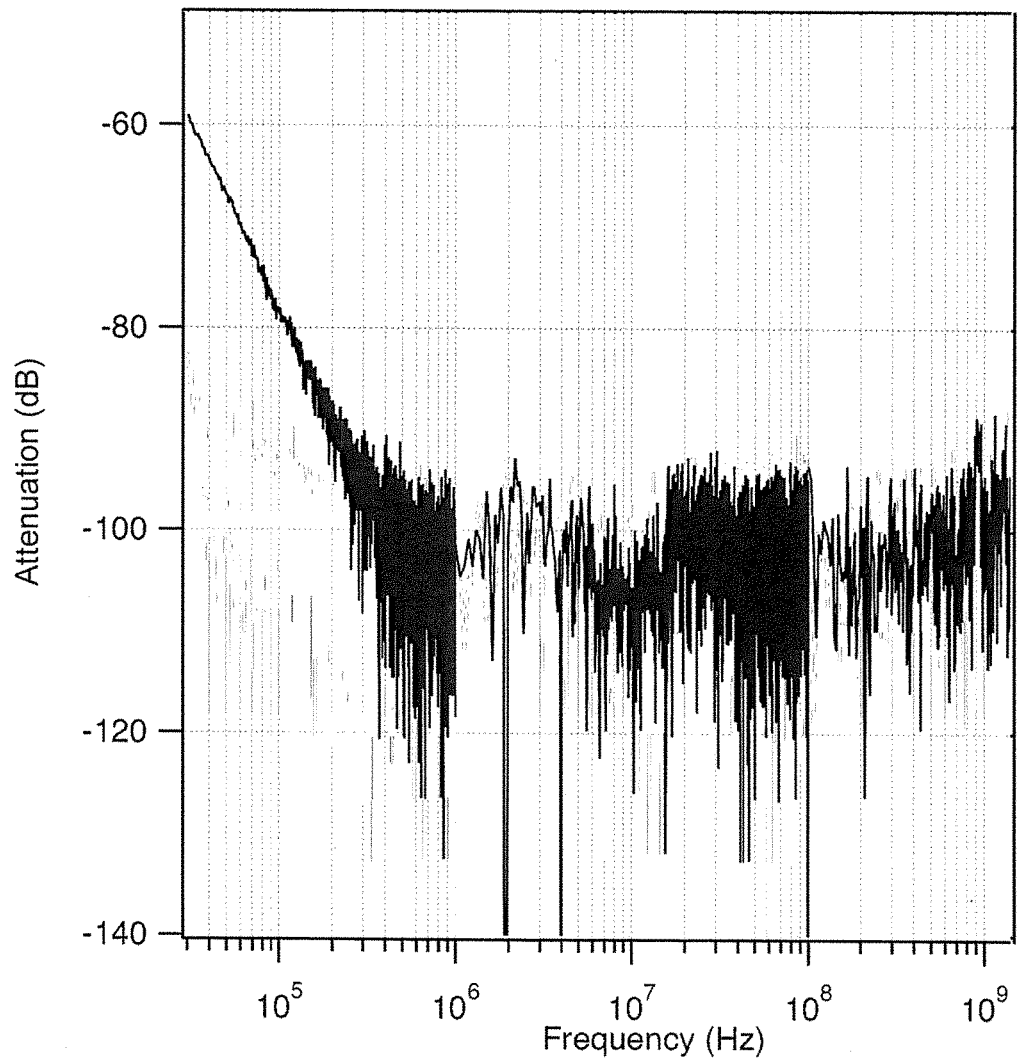
FIG. 8 depicts a plot that illustrates that the present invention's devices also perform at room temperature, where the grey curve denotes transmission and the large slope indicates efficient low-pass filtering. In this case, already at 10 MHz the noise floor of the measurement circuit (approximately −100 dB) is reached.

The performance of the present invention's devices have been verified both at room temperature (in terms of their electrical filtering characteristics) and at low temperatures (in terms of their electronic thermalizing characteristics). FIG. 7 illustrates that the cut-off frequency (and hence rise time of signals) can be changed, and optimized for different types of experiments, simply by changing the surface mount components (R, C, or pi-filters are all compatible with industrial soldering robots). FIG. 8 depicts a plot that illustrates that the present invention's devices also perform at room temperature, where the grey curve denotes transmission and the large slope indicates efficient low-pass filtering. In this case, already at 10 MHz the noise floor of the measurement circuit (approximately −100 dB) is reached.

Figure 9:
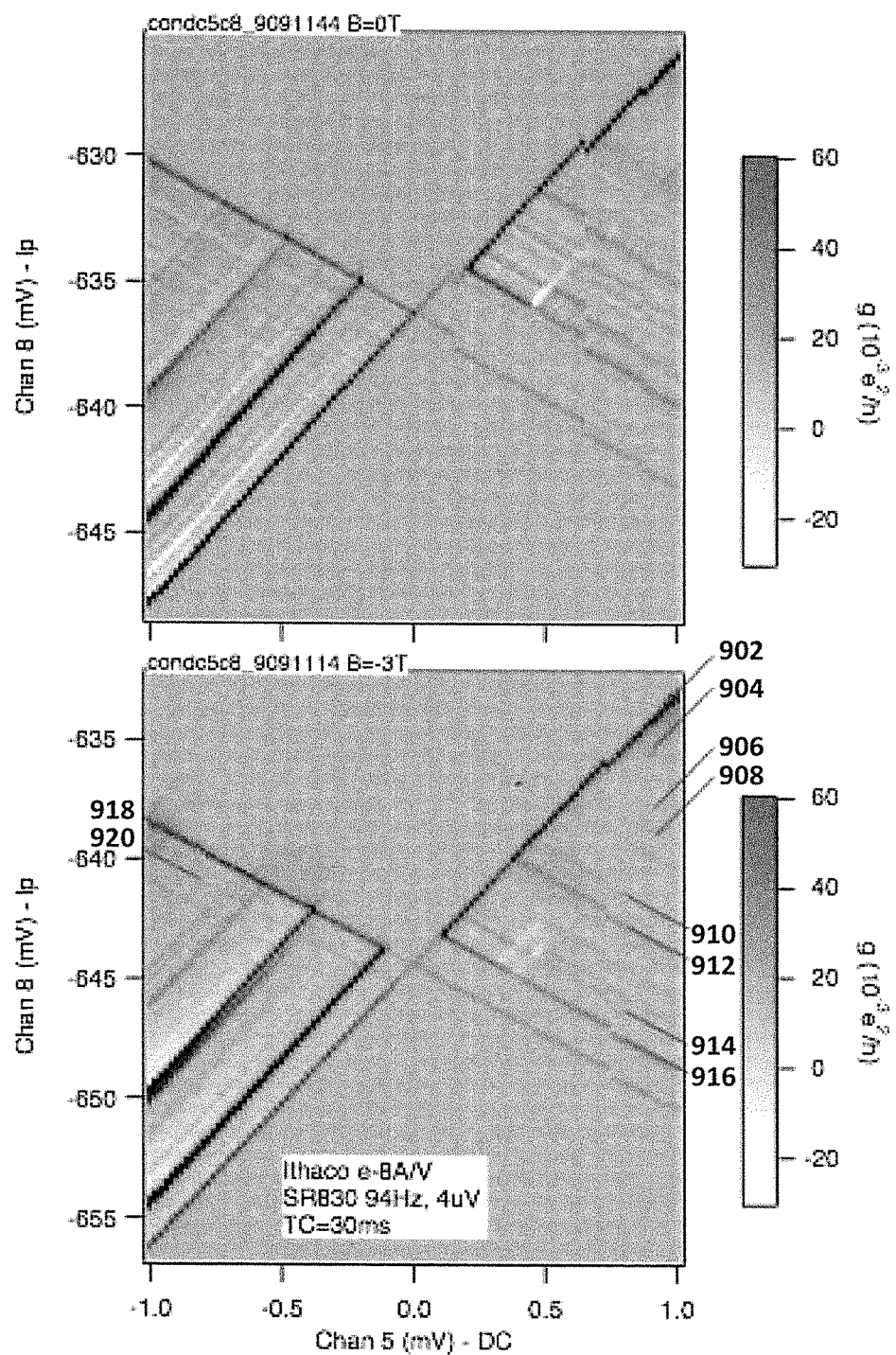
FIG. 9 illustrates performance in an actual qubit experiment at zero and moderate magnetic field.
Figure 10:
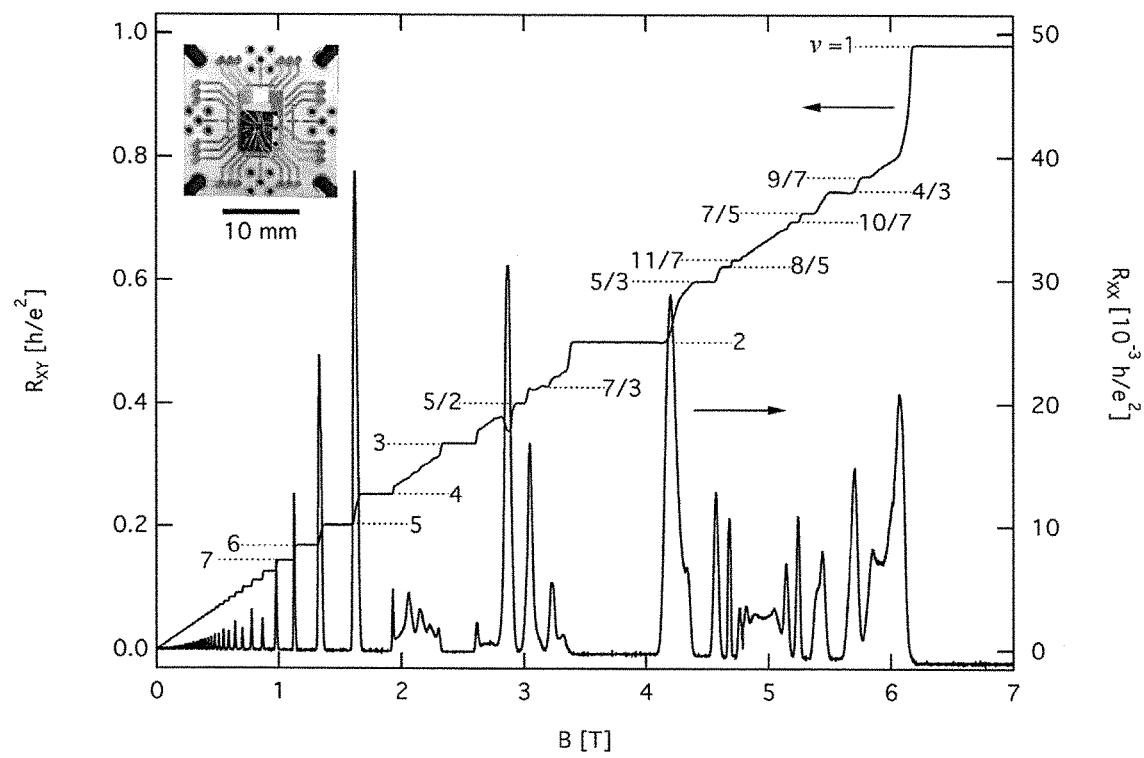
FIG. 10 illustrates performance in high magnetic fields.

Operation at low temperatures (below 100 mK) was demonstrated in zero and weak magnetic fields, as well as in strong magnetic fields up to 10 Tesla. The improvement of electron temperature was quantified by electrical measurements of quantum dots, solid-state qubits, and quantum hall systems. The use of these filters resulted in a reduction of the effective electron temperature and electrical noise by a factor exceeding 5-10, as compared to measurements in the same type of refrigerators without the present invention's devices. FIG. 9 illustrates performance in an actual qubit experiment at zero and moderate magnetic field. Here, a semiconducting spin qubit has been tuned up as an almost closed quantum dot. Sharp excitations of the quantum dot can be observed, demonstrating a low electron temperature and a low background noise. The RMS current noise in the Coulomb blockage regime was measured to be a few tens of fA ($10^{-15}$ Amperes) for an equivalent noise bandwidth of 4 Hz (set by the rise time Ithaco current amplifier). The background noise determines how long a signal has to be averaged in order to reveal a certain signal. The bottom panel shows that equally high quality data was obtained at moderate magnetic field, demonstrating that the present invention's filter performance is not affected by noise generated by vibrations and induction. Quantum states split by the Zeeman energy (labeled 902 through 920). FIG. 10 illustrates performance in high magnetic fields: Hall resistance, $R_{XY}$, and longitudinal resistance, $R_{XX}$, as a function of magnetic field, B. The sample (inset) contains a 2-dimensional electron gas in a GaAs/AlGaAs quantum well. The presence of plateaus in $R_{XY}$ and vanishing $R_{XX}$ for fractional filling density (v) indicate low electron temperature and electrical noise (fractional quantum hall effect).

The present invention methods and devices offer a reliable and cost-effective way of manufacturing signal-conditioning devices, and the performance of the present invention's methods and devices have been demonstrated in various cryostats. The present invention's methods and devices offer several innovations compared to published or commercially available devices, including, but not limited to, low-pass filters or copper powder heat sinks. One important feature according to the teachings of the present invention is that cooling and noise reduction is achieved on multiple signal lines simultaneously (currently, 24 signal lines within one device), and that each device can be manufactured from commercially available or custom-made, relatively cheap components. All components are selected based on their small size, availability, and performance at extremely low temperatures. The present invention's devices are very compact in size, are of modular design (stacked on top of each other and in series to improve performance), and can easily be serviced and reconfigured for a range of applications. For example, the DC resistance, the capacitive load and the low-frequency cut-off frequency can all be adjusted for each individual signal line, without having to purchase a new filter array.

The present invention, therefore, provides a device to reduce noise and temperature during measurements in cryostats, wherein the device comprises any of, or a combination of, the following PC boards, with each board conditioning a different frequency range: (a) a RC-PC board having a two-stage RC filter in series with a surface-mounted pi-filter (e.g., a 7-segment surface-mounted pi-filter that is configured for filtering a frequency range of 1 kHz-100 MHz); (b) a RF-PC board having a plurality of surface-mounted pi-filters in series (e.g., three 7-segment surface-mounted pi-filter surface-mounted pi-filters in series configured with different cut-off frequencies, e.g., 80 MHz, 1450 MHz, and 5 GHz, respectively), each configured with different low-frequency cutoff frequencies; and (c) a Sapphire-PC board having a sapphire substrate having high heat conductivity at low temperature with thin metal films routed in a meandering fashion, wherein each of the boards may be further enclosed in a high-conductivity metal enclosure such as a gold-plated high conductivity copper enclosure.

The present invention also discloses a kit to reduce noise and temperature during measurements in cryostats comprising, said kit comprising the following modular filters, each modular filter conditioning a different frequency range: (a) a RC-PC board having a two-stage RC filter in series with a surface-mounted pi-filter (e.g., a 7-segment surface-mounted pi-filter that is configured for filtering a frequency range of 1 kHz-100 MHz), the RC-PC board enclosed in a high-conductivity metal enclosure; (b) a RF-PC board having a plurality of surface-mounted pi-filters in series (e.g., three 7-segment surface-mounted pi-filter surface-mounted pi-filters in series configured with different cut-off frequencies, e.g., 80 MHz, 1450 MHz, and 5 GHz, respectively), each configured with different low-frequency cutoff frequencies, the RF-PC board enclosed in a high-conductivity metal enclosure; and (c) a Sapphire-PC board having a sapphire substrate having high heat conductivity at low temperature with thin metal films routed in a meandering fashion, the Sapphire-PC board enclosed in a high-conductivity metal enclosure.

As noted above, particular embodiments of the subject matter have been described, but other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

CONCLUSION

A system and method has been shown in the above embodiments for the effective implementation of methods and devices to reduce noise and temperature during measurements in cryostats. While various preferred embodiments have been shown and described, it will be understood that there is no intent to limit the invention by such disclosure, but rather, it is intended to cover all modifications falling within the spirit and scope of the invention, as defined in the appended claims.

The invention claimed is:

1. A device to reduce noise and temperature during measurements in a cryostat, said device comprising each of the following PC boards, with each conditioning a different frequency range: a RC-PC board having a two-stage RC filter in series with a surface-mounted pi-filter; a RF-PC board having a plurality of surface-mounted pi-filters in series, each configured with different low-frequency cutoff frequencies; and a Sapphire-PC board having a sapphire substrate having high heat conductivity at low temperature with thin film metal wires routed in a pre-defined fashion, the RC-PC serves as structural support for a plurality of electrical connectors, the electrical connection between the electrical connectors and the thin film metal wires is configured to provide cooling and noise reduction to multiple signal lines simultaneously.

2. The device of claim 1, wherein said surface mounted pi-filter in said RC-PC board is a 7-segment surface-mounted pi-filter.

3. The device of claim 2, wherein said 7-segment surface-mounted pi-filter is configured for filtering a frequency range of 1 kHz-100 MHz.

4. The device of claim 1, wherein said RC-PC board is based on a four-layer PC board that includes various inter-layer vias and intra-layer ground planes to improve heat sinking and mutual shielding.

5. The device of claim 1, wherein in said RC-PC board, 12 signal lines are filtered and heat-sunk on the front side and 12 signal lines are on the back side.

6. The device of claim 1, wherein said RC-PC board further comprises: non-magnetic micro-D connectors, surface mount capacitors, resistor, and copper ground and cooling planes.

7. The device of claim 1, wherein said RC-PC board is further enclosed in a high-conductivity metal enclosure.

8. The device of claim 7, wherein said high-conductivity metal enclosure is a gold-plated high conductivity copper enclosure.

9. The device of claim 1, wherein said surface mounted pi-filter in said RF-PC board is a 7-segment surface-mounted pi-filter.

10. The device of claim 1, wherein said plurality of surface-mounted pi-filters in said RF-PC board in series comprises three 7-segment surface-mounted pi-filter surface-mounted pi-filters in series configured with different cut-off frequencies.

11. The device of claim 10, wherein said different cut-off frequencies for each of the three surface-mounted pi-filters in series are 80 MHz, 1450 MHz, and 5 GHz, respectively.

12. The device of claim 1, wherein said RP-PC board is further enclosed in a high-conductivity metal enclosure.

13. The device of claim 12, wherein said high-conductivity metal enclosure is a gold-plated high conductivity copper enclosure.

14. The device of claim 1, wherein said RF-PC board comprises a four-layer PC board that includes various inter-layer vias and intra-layer ground-planes to improve heat sinking and mutual shielding, and surface-mount components.

15. The device of claim 1, wherein said device further comprises sound absorbing hardware near a rotary valve of a pulse tube and on top of said cryostat to reduce acoustic noise.

16. The device of claim 15, wherein said sound absorbing hardware comprises sound absorbing foam.

17. The device of claim 16, wherein said sound absorbing foam is made from heavy rubber and foam.

* * * * *